(12) United States Patent
Birkicht et al.

(10) Patent No.: US 11,745,263 B2
(45) Date of Patent: Sep. 5, 2023

(54) APPARATUS AND METHOD FOR A PRESSURE-SINTERING CONNECTION

(71) Applicant: SEMIKRON ELEKTRONIK GMBH & CO. KG, Nuremberg (DE)

(72) Inventors: Dominic Birkicht, Emskirchen (DE); Kurt-Georg Besendörfer, Cadolzburg (DE); Silke Kraft, Nuremberg (DE); Erik Michaelsen, Lauf (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 17/861,102

(22) Filed: Jul. 8, 2022

(65) Prior Publication Data
US 2023/0023512 A1    Jan. 26, 2023

(30) Foreign Application Priority Data
Jul. 22, 2021    (DE) ..................... 10 2021 118 948.9

(51) Int. Cl.
*B23K 20/00* (2006.01)
*B22F 7/06* (2006.01)
(Continued)

(52) U.S. Cl.
CPC .............. *B22F 7/064* (2013.01); *B22F 3/14* (2013.01); *B23K 20/02* (2013.01); *B23K 20/023* (2013.01)

(58) Field of Classification Search
CPC ... H01L 2224/83203; H01L 2224/8384; H01L 2224/75983; H01L 2224/75744;
(Continued)

(56) References Cited

U.S. PATENT DOCUMENTS

| 10,312,213 B2 * | 6/2019 | Beck ..................... H01L 23/473 |
| 2013/0040424 A1 * | 2/2013 | Bayerer ................. H01L 24/83 |
| | | 156/583.1 |

(Continued)

FOREIGN PATENT DOCUMENTS

| DE | 102014114097 A1 | 3/2016 |
| DE | 102014114983 A1 | 3/2016 |

(Continued)

OTHER PUBLICATIONS

DE 10 2021 1189489, German Report dated Jul. 22, 2021, 6 pages—German, 6 pages—English.

*Primary Examiner* — Erin B Saad
(74) *Attorney, Agent, or Firm* — Andrew F. Young; NOLTE LACKENBACH SIEGEL

(57) ABSTRACT

A method and an apparatus for the pressure-sintering connection of a first and a second connection provide a frame element lowerable onto a frame surface surrounding the supporting surface, having a sintering ram lowerable lowered from the normal direction onto the second connection partner and exerts pressure thereon, and converting a sintering paste between the connection partners into a sintered metal, and having an auxiliary apparatus for the arrangement of a separating film for the peripheral covering of the frame surface and the connection partners. This arrangement of the separating film produces an inner region bounded by the frame element and bounded by a separating film portion within the frame element and by the supporting surface, and injection opening and an outlet opening allow a second gas to flush through said inner region from the injection opening to the outlet opening and displace a first gas.

14 Claims, 4 Drawing Sheets

(51) Int. Cl.
*B22F 3/14* (2006.01)
*B23K 20/02* (2006.01)

(58) Field of Classification Search
CPC .......... H01L 2224/75252; H01L 2224/75251; B23K 1/0016; B23K 20/002; B23K 20/023; B23K 20/26; B23K 2101/40
See application file for complete search history.

(56) References Cited

U.S. PATENT DOCUMENTS

| | | | | |
|---|---|---|---|---|
| 2013/0134572 | A1* | 5/2013 | Lenniger | H01L 23/367 438/122 |
| 2013/0203218 | A1* | 8/2013 | Bayerer | H01L 21/50 156/382 |
| 2014/0013595 | A1* | 1/2014 | Hong | H01L 24/89 156/60 |
| 2014/0035117 | A1* | 2/2014 | Hohlfeld | H01L 24/48 257/683 |
| 2014/0224409 | A1* | 8/2014 | Hauenstein | H01L 23/5385 156/89.12 |
| 2017/0066075 | A1* | 3/2017 | Matsubayashi | B23K 1/0016 |
| 2021/0121962 | A1* | 4/2021 | Birkicht | H01L 24/83 |

FOREIGN PATENT DOCUMENTS

| | | |
|---|---|---|
| DE | 102015120156 A1 | 5/2017 |
| DE | 102019128667 B3 | 9/2020 |
| DE | 102020116084 B3 | 7/2021 |
| WO | WO 2018/215524 A1 | 11/2018 |

* cited by examiner

APPARATUS AND METHOD FOR A PRESSURE-SINTERING CONNECTION

CROSS REFERENCE TO RELATED APPLICATIONS

This application relates to and claims priority to DE 10 2021 118 948.9 filed Jul. 22, 2021, the entire contents of which are incorporated herein fully by reference.

FIGURE SELECTED FOR PUBLICATION

FIG. 3

BACKGROUND OF THE INVENTION

Field of the Invention

The invention describes an apparatus for the pressure-sintering connection of a first and a second connection partner, having a supporting surface for the arrangement of the first connection partner, having a frame element which can be lowered from the normal direction of the supporting surface onto a frame surface surrounding the supporting surface, and having an auxiliary apparatus for the arrangement of a separating film for the peripheral covering of the frame surface and the connection partners.

Description of the Related Art

DE 10 2015 120 156 A1 discloses an apparatus of the type in question having a pressing ram, which has an elastic cushion element, for the materially bonded pressure-sintering connection of a first connection partner to a second connection partner of a power-electronics component, wherein the elastic cushion element of the pressing ram is surrounded by a dimensionally stable frame, within which the cushion element and a guide part of the pressing ram are guided in a linearly movable manner such that the dimensionally stable frame lowers onto the first connection partner or onto a work carrier with the first connection partner arranged therein and, following abutment against same, the pressing ram together with the elastic cushion element is lowered onto the second connection partner and a required force for connecting the first connection partner to the second connection partner is exerted on the elastic cushion. It is common practice in the art for a separating film to be arranged here during the sintering operation between the cushion element, more generally the sintering ram, and at least the second connection partner. Frequently, following the sintering operation, this separating film sticks to the second connection partner, generally to both connection partners.

DE 10 2011 080 929 B4 discloses a method for producing a composite, in which at least two joining partners are connected fixedly to one another, having the following steps: providing a first joining partner and a second joining partner; providing a connecting means; providing a sealing means; providing a reactor having a pressure chamber; providing a heating element; arranging the first joining partner, the second joining partner and the connecting means in the pressure chamber such that the connecting means is located between the first joining partner and the second joining partner; producing a gas-tight region in which the connecting means is arranged; producing a gas pressure in the pressure chamber outside the gas-tight region such that the gas pressure acts on the gas-tight region and presses the first joining partner, the second joining partner and the connecting means located between them against one another with at least 2 MPa; heating the first joining partner, the second joining partner and the connecting means to a specified maximum temperature of at least 210° C. using the heating element; subsequently cooling the first joining partner, the second joining partner and the connecting means; wherein the volume of the closed pressure chamber is smaller than or equal to 200 ml.

ASPECTS AND OBJECTS OF THE INVENTION

With knowledge of the prior art and with the desire to use a sintering paste, the metallic portion of which can comprise not only precious metal, but also a portion of a semiprecious metal, the invention is based on the object of specifying an apparatus in which the sintering operation can take place in an atmosphere which does not consist or at least does not only consist of ambient air.

This object is achieved according to the invention by an apparatus for the pressure-sintering connection of a first and a second connection partner, having a frame element which can be lowered from the normal direction of the supporting surface onto a frame surface surrounding the supporting surface, having a sintering ram which can be lowered from the normal direction onto the second connection partner and exerts pressure thereon, as a result of which a sintering paste between the connection partners is converted into a sintered metal, and having an auxiliary apparatus for the arrangement of a separating film for the peripheral covering of the frame surface and the connection partners, wherein this arrangement of the separating film produces an inner region which is bounded by the frame element and is bounded by a separating film portion lying within the frame element and by the supporting surface, wherein an injection opening and an outlet opening are arranged in such a manner that a second gas can flush through said inner region from the injection opening to the outlet opening and, in the process, displaces a first gas which is already present.

It is advantageous here if the first gas is ambient air and the second gas is an inert gas, for example nitrogen. It may also be preferred if the sintering paste has a metallic portion of a semiprecious metal, for example copper or nickel. The semiprecious metal here can have a metallic portion of more than 80%, in particular more than 95%.

It may be preferred if the injection opening, the outlet opening or both openings are designed to be closable towards the inner region, preferably to be closable flush with the adjacent surface section.

It may be advantageous here if the supporting surface and the frame surface are both part of an abutment of a sintering press, and the supporting surface is preferably arranged in a depression. Alternatively thereto, it may be advantageous if the supporting surface and preferably also the frame surface are both part of a work carrier which is arranged on an abutment of a sintering press.

It may be preferred if the injection opening, and preferably also the outlet opening, is arranged between that section of the supporting surface on which the first connection partner rests flush and that section of the frame surface which is provided for the frame element to rest flush thereon. It may be in particular preferred here if the frame element has a recess which, in the normal direction, is aligned with the injection opening and preferably also with the outlet opening.

It may also be advantageous if the injection opening and the outlet opening are arranged in such a manner that a transverse flow of the second gas can be formed in the inner region.

In particular, it is advantageous if the outlet opening is connected to an, in particular controllable or regulatable, suction device.

In principle, it may be advantageous if the separating film is a PTFE film and preferably has a thickness of between 10 µm and 200 µm, in particular between 30 µm and 100 µm.

The abovementioned object is furthermore achieved according to the invention by a method for the pressure-sintering connection of a first and a second connection partner by means of an apparatus mentioned above and the following method steps:

a) arranging the second connection partner on the first connection partner with a sintering paste layer between them;
b) arranging the first connection partner on the supporting surface;
c) arranging the separating film, the latter peripherally covering the two connection partners and the frame surface;
d) lowering the frame element onto the frame surface with the separating film arranged in between;
e) injecting a second gas into the inner region, as a result of which a first gas which is already present is displaced by being flushed out of the inner region through the outlet opening;
f) forming the pressure-sintering connection, wherein a sintering ram presses from the normal direction onto the second connection partner and, in the process, the sintering paste is converted into a sintered metal;
g) raising the frame element.

It may be advantageous here if, during method step e) or after the latter, the first gas is sucked through the outlet opening.

It may also be advantageous if, during method step e) or after the latter, the first connection partner is heated to a process temperature. As is common practice in the art, usually in this case the sintering paste and the second connection partner are also heated.

It may be preferred if, in method step e), first of all a sintering ram frame is lowered onto a frame section of the first connection partner, then the sintering ram is lowered and, after the sintering connection is formed, the sintering ram and the sintering ram frame are raised in the normal direction.

In this connection, it may also be preferred if first of all the sintering ram is raised, followed by the sintering ram frame.

Of course, the features, in particular the injection opening and the outlet opening, which are respectively referred to in the singular, can be arranged multiple times in the apparatus according to the invention, unless this is explicitly precluded or precluded per se or is inconsistent with the concept of the invention.

It goes without saying that the different configurations of the invention can be realized individually or in any desired combinations in order to achieve improvements, irrespective of whether said configurations are disclosed in connection with the description of the apparatus or of the method. In particular, the features mentioned and explained above and hereinafter can be used not only in the combinations indicated, but also in other combinations or by themselves, without departing from the scope of the present invention.

According to another aspect and object of the present invention there is provided a method and an apparatus for the pressure-sintering connection of a first and a second connection partner are presented, having a frame element which can be lowered from the normal direction of the supporting surface onto a frame surface surrounding the supporting surface, having a sintering ram which can be lowered from the normal direction onto the second connection partner and exerts pressure thereon, as a result of which a sintering paste between the connection partners is converted into a sintered metal, and having an auxiliary apparatus for the arrangement of a separating film for the peripheral covering of the frame surface and the connection partners, wherein this arrangement of the separating film produces an inner region which is bounded by the frame element and is bounded by a separating film portion lying within the frame element and by the supporting surface, wherein an injection opening and an outlet opening are arranged in such a manner that a second gas can flush through said inner region from the injection opening to the outlet opening and, in the process, displaces a first gas which is already present.

Further explanations of the invention, advantageous details and features are evident from the following description of the exemplary embodiments of the invention illustrated schematically in FIGS. 1 to 7, or from respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
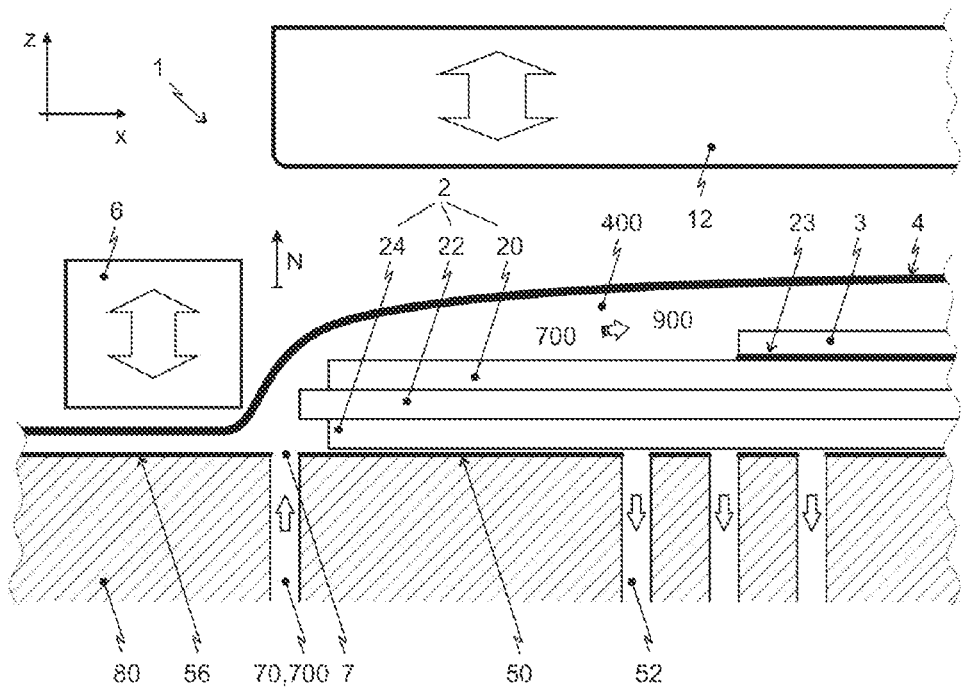
FIGS. 1 to 3 each show a lateral sectional view of various parts of a first refinement of the apparatus according to the invention during method step e) of the method according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
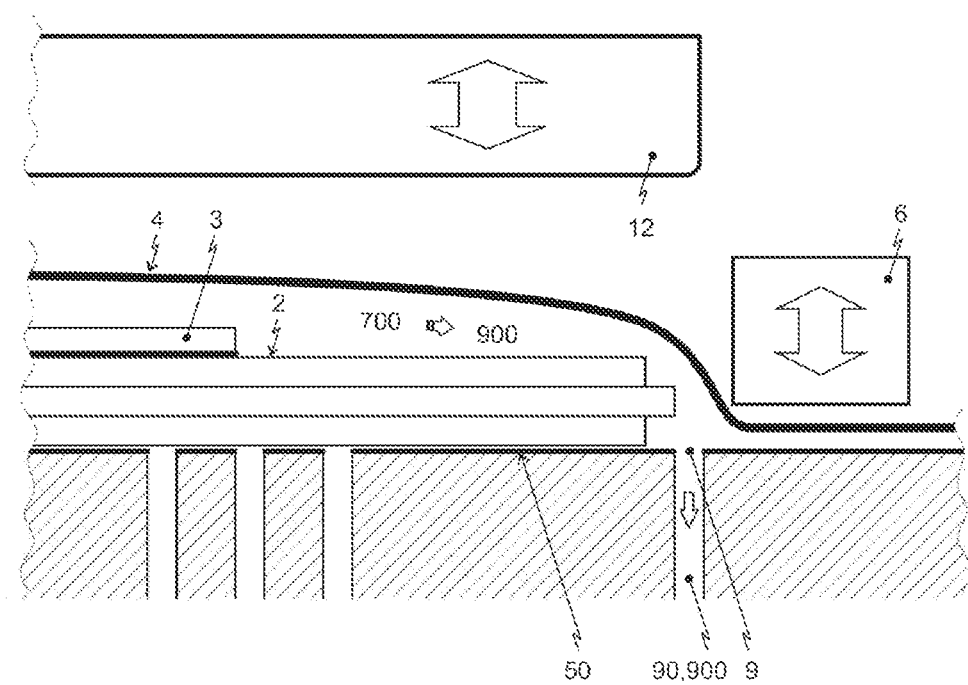
Figure 3:
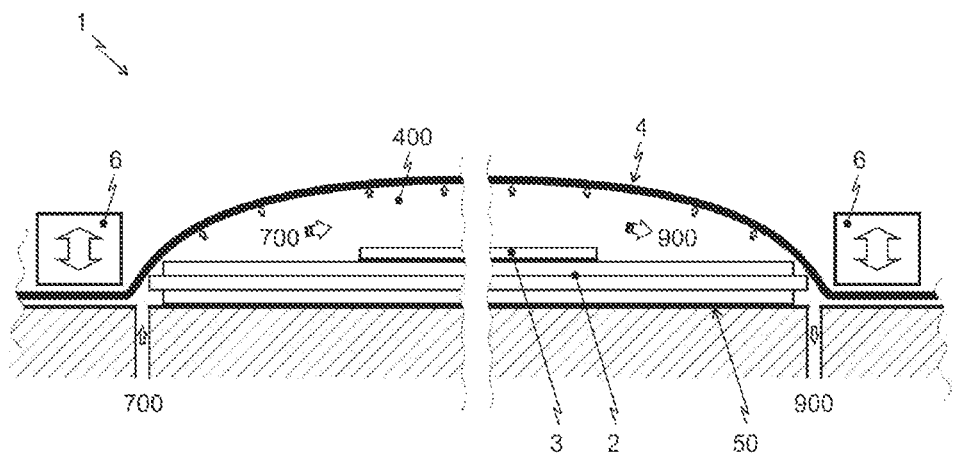

FIGS. 1 to 3 each show a lateral sectional view of various parts of a first refinement of the apparatus 1 according to the invention during method step e) of the method according to the invention. An abutment 80 of a sintering press that is also referred to conventionally in the art as a lower die is illustrated. Also illustrated, as parts of an upper die of the sintering press, are a frame element 6 and a sintering cushion 12. The frame element 6 is provided and designed to be moved in the direction of the abutment 80 and then to rest indirectly or directly there on a frame surface 56. Subsequently, the sintering cushion 12 is lowered in the direction of a supporting surface 50 of the abutment, on which the connection partners 2, 3 that are to be connected are arranged. By pressing the sintering cushion 12 onto the connection partners 2, 3, a sintering paste 23 which is arranged between the first and second connection partners 2, 3 is converted into a sintered metal and forms a materially bonded and electrically conductive sintering connection between the connection partners 2, 3. The frame element 6 restricts the lateral extent of the sintering cushion 12, which is conventionally designed in the art as a silicone cushion.

The first connection partner 2, here without restricting the generality, a power-electronics substrate with a ceramic insulating body 22 and with copper layers 20, 24 on its respective surfaces, lies on the supporting surface 50 of the abutment 80 facing the upper die of the sintering press, with the copper layer 20 which faces away from the lower die forming a plurality of strip conductors.

In this refinement, the abutment 80 furthermore has suction channels 52 which are designed and provided to fix the substrate on the supporting surface 50 of the abutment 80 by means of negative pressure at least during a sintering operation.

In order to protect the sintering ram 12 and the connection partners 2, 3, a separating film 4, here a PTFE film with a thickness of approx. 50 μm is conventionally arranged in the art. This separating film 4 is arranged by means of an auxiliary apparatus over the two connection partners 2, 3 and over a frame surface 56 indirectly surrounding the supporting surface 50 and the first connection partner 2. This separating film 4 preferably also reaches beyond this frame surface 56.

During method step d), the frame element 6 is lowered onto the frame surface 56 and comes to lie on a portion of the separating film 4 that is arranged above the frame surface 56. By this means, the separating film 4 is fixed in its position and forms an inner region 400 between the supporting surface 50 and the separating film 4 that at this time is filled with a first gas 900, in this refinement ambient air.

In this refinement, the sintering paste 23 has only a portion of precious metal particles made of silver; the remaining metal particles here are semiprecious metal particles, more precisely copper particles. As is conventional in the art, the first connection partner 2 is heated here by means of a heating device arranged in the abutment 80 to a process temperature in the range between 190° C. and 250° C. The sintering paste 23 and the second connection partner 3 are also heated here at the same time. This heating of the sintering paste 23 and the reaction thereof with the first gas 900 reduces the sintering capability of the sintering paste 23. In order to counteract this, in method step e) preferably up to at least 95% of the first gas 900 is replaced by a second gas 700, an inert gas, here nitrogen.

Figure 6:
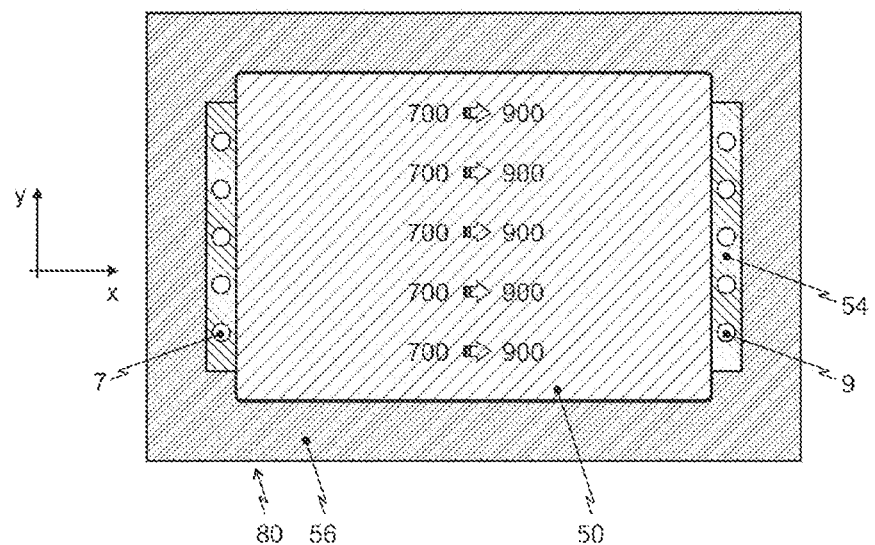
FIGS. 6 and 7 each show top views of various refinements of the apparatus according to the invention.
Figure 7:
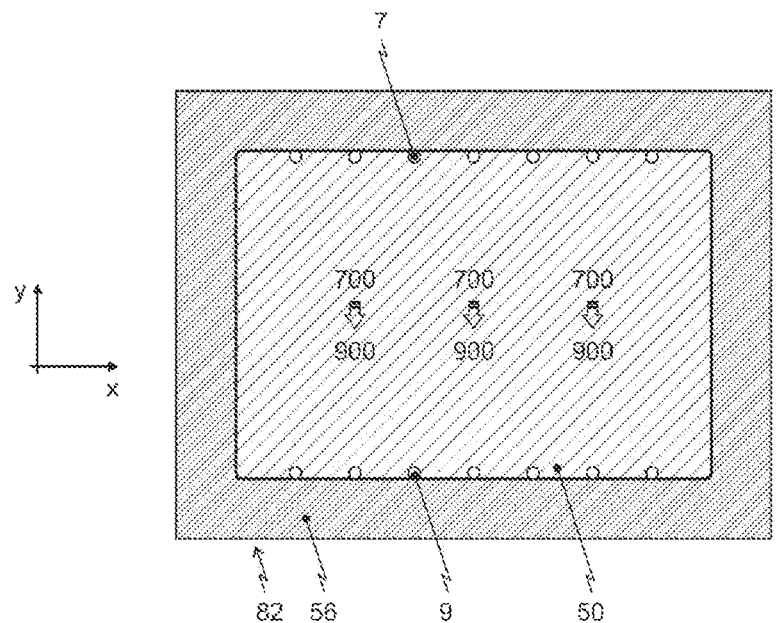

For this purpose, the abutment 80 has an injection channel 70 with an injection opening 7 in the surface of the abutment 80 and an outlet channel 90 with an outlet opening 9 likewise in this surface of the abutment 80. The injection opening and also the outlet opening 7, 9 are arranged here in a surface section between the section of the supporting surface 50 that is covered by the first connection partner 2 and the frame surface 56 of the abutment 80. Therefore, the second gas 700 can be injected via the injection channel 70 and the injection opening 7 and thus the first gas 900 can be displaced through the outlet opening 9 and the outlet channel 90. The inner region 400; also compare FIGS. 6 and 7, is therefore flushed, as a result of which there is virtually only still the second gas 700 in the inner region 400 for subsequently heating up the first connection partner 2. The pressure-sintering operation that is conventional in the art is subsequently carried out.

Figure 4:
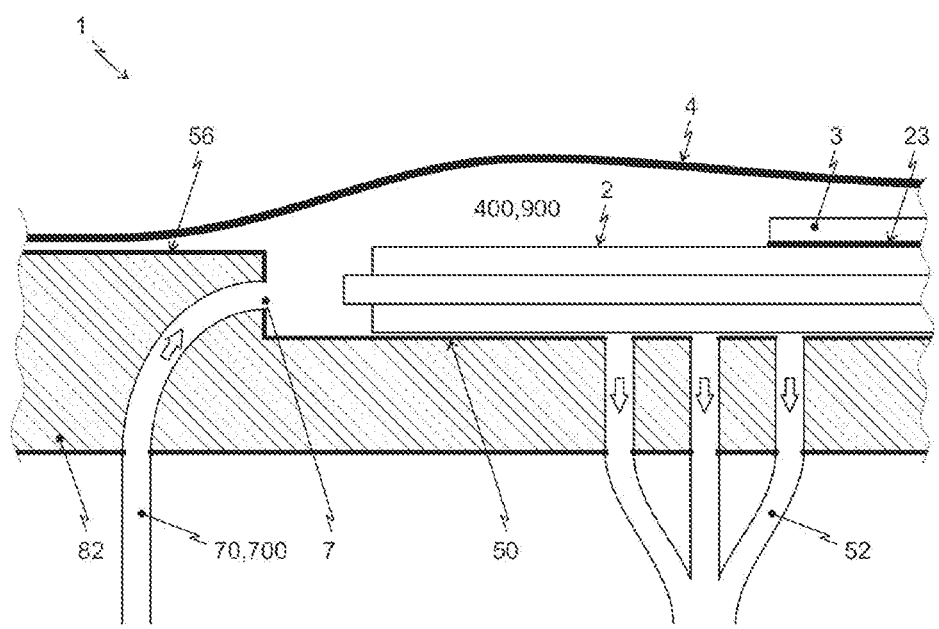
FIG. 4 shows a lateral sectional view of part of a second refinement of the apparatus according to the invention.

FIG. 4 shows a lateral sectional view of part of a second refinement of the apparatus 1 according to the invention. In this refinement, a work carrier 82 which serves for transporting the connection partners 2, 3 and temporarily rests on the lower die of the sintering press during the sintering operation has the supporting surface 50. The connection partners, without restricting the generality, are arranged here in a recess of the work carrier 82, the first connection partner 2 resting on the supporting surface 50. In this refinement, but not restricted thereto, the injection opening and also, although not illustrated, the outlet openings 7, 9 are each arranged laterally in the recess of the work carrier 82. This makes it possible for the lateral extent of the recess orthogonally to the normal direction N to be only minimally larger than the extent of the first connection partner 2.

Therefore, a second gas 700 can also be injected here into the inner region 400 via the injection opening 7, as a result of which the first gas 900 which is present is displaced and thus flushed out of the interior space 400.

Also illustrated here are three suction channels 52 of the work carrier 82 that lead into the lower die and are merged together there to form a suction channel. The suction channels 52 and also the injection channel and outlet channel 70, 90 are of course sufficiently sealed between the work carrier 82 and the lower die.

Figure 5:
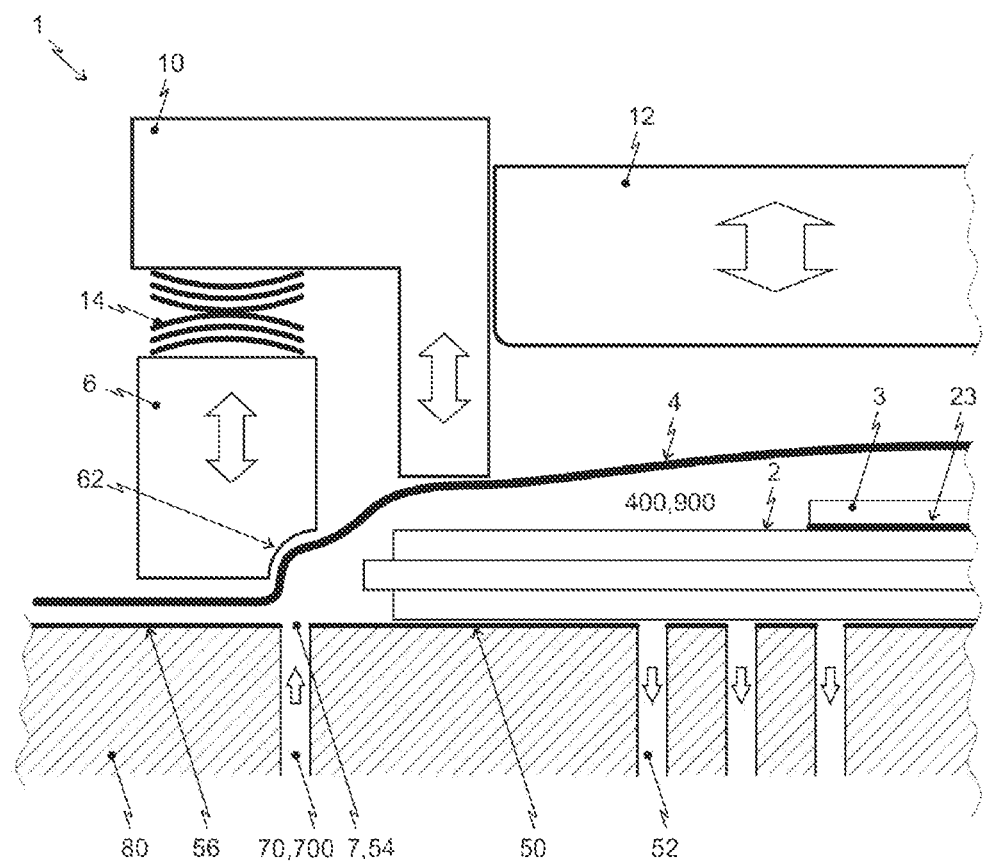
FIG. 5 shows a lateral sectional view of part of a third refinement of the apparatus according to the invention.

FIG. 5 shows a lateral sectional view of part of a third refinement of the apparatus 1 according to the invention. This refinement differs from the first in that the injection opening and also, although not explicitly illustrated, the outlet opening 7, 9 are arranged in the frame surface 56. In order nevertheless, when the frame element 6 is lowered, to enable gas to be injected or sucked off, the frame element 6 has a recess 62 above the injection opening or outlet opening 7, 9, as viewed in the normal direction N.

Also illustrated as part of the upper die of the sintering press is a sintering ram 12, designed here as a sintering cushion made from silicone with a Shore A hardness of 56 and stabilized by metallic additives in such a manner that it can be used at temperatures of 21.0° C. and a pressure of 35 MPa. This sintering cushion is framed by a sintering ram frame 10 to which the frame element 6 is connected via spring elements 14. During the lowering of the upper die, first of all the frame element 6 is lowered in the region of the frame surface 56 onto the separating film 4, as a result of which the latter is fixed and the inner region 400 is formed. The first gas 900 is subsequently flushed out of the resulting interior space 400 in the manner already described above. Subsequently, the sintering ram frame 10 is lowered onto an edge region of the first connection partner 2 with a separating film 4 arranged in between. Subsequently, in turn, the sintering ram 12 is lowered onto the second, and here also first connection partner 2, 3, with the separating film 4 arranged in between and at the latest here a second gas which is also still present is displaced out of the inner region 400, preferably through the outlet opening. By means of the pressure exerted by the sintering ram 12, the sintering paste 23 is now converted into a sintered metal and the materially bonded and electrically conductive connection between the connection partners 2, 3 formed.

FIGS. 6 and 7 each show top views of various refinements of the apparatus according to the invention. FIG. 6 illustrates a supporting surface 50 of an abutment 80, on the first narrow side of which a plurality of injection openings 7 are arranged. To permit a transverse flow, a plurality of outlet openings 9 are arranged on the opposite narrow side. By means of this arrangement, in a method step e), a second gas 700 can be injected via the injection openings 7 into the inner region 400, cf. FIGS. 1 to 3, and therefore the first gas 900 which is present can be displaced and escapes or is sucked out through the outlet openings 9. The peripheral frame surface 56 is illustrated directly adjacent to the supporting surface 50.

FIG. 7 illustrates a supporting surface 50 of a work carrier 82 with a recess, cf. FIG. 4, on the first longitudinal side of which a plurality of injection openings 7 are arranged. A plurality of outlet openings 9 are arranged on the opposite longitudinal side. By means of this arrangement, in a method step e), a second gas 700 can be injected via the injection openings 7 into the inner region, cf. FIG. 4, and therefore the first gas 900 which is present can be displaced and escapes or is sucked out through the outlet openings 9. The peripheral frame surface 56 is also illustrated here directly adjacent to the supporting surface 50.

LIST OF REFERENCE SIGNS

1 Apparatus
10 Sintering ram frame
12 Sintering ram
14 Spring elements
2 First connection partner
20, 24 Copper layers of 2
22 Ceramic insulating body of 2
23 Sintering paste
3 Second connection partner
4 Separating film
400 Inner region
50 Supporting surface
52 Suction channels
56 Frame surface
58 Sections
6 Frame element
62 Recess in 6
7 Injection opening
70 Injection channel
700 Second gas
80 Abutment
82 Work carrier
9 Outlet opening
90 Outlet channel
900 First gas Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. An apparatus, for creating a pressure-sintering connection of a first and a second connection partner, comprising:
a supporting surface supporting said first and said second connection partner;
said second connection partner on said first connection partner;
said supporting surface having a frame element lowerable from a normal direction (N) of the supporting surface onto a frame surface surrounding the supporting surface;
a sintering ram lowerable from the normal direction onto the second connection partner operative to exert pressure on said second connection partner as a result of which a sintering paste between the connection partners is converted into a sintered metal;
an auxiliary apparatus operative to arrange a separating film that peripherally covers of the frame surface and the connection partners;
wherein the arrangement of the separating film produces an inner region which is bounded by the frame element and is bounded by a separating film portion lying within the frame element and by the supporting surface; and
wherein an injection opening and an outlet opening are arranged on said supporting surface in such a manner that a second gas flushing through said inner region from said injection opening to said outlet opening displaces a first gas which is already present in said inner region.

2. The apparatus, according to claim 1, wherein:
the supporting surface and the frame surface are both part of an abutment of a sintering press; and
the supporting surface is arranged in a depression.

3. The apparatus, according to claim 1, wherein:
the supporting surface and the frame surface are both part of a work carrier arranged on an abutment of a sintering press.

4. The apparatus, according to claim 1, wherein:
at least one of the injection opening and the outlet opening are closable towards the inner region; and
said at least one closable opening is closable flush with an adjacent surface section.

5. The apparatus, according to claim 1, wherein:
at least one of the injection opening and the outlet opening, is arranged between a section of the supporting surface on which the first connection partner rests flush and a section of the frame surface which is provided for the frame element to rest flush thereon.

6. The apparatus, according to claim 5, wherein:
the frame element has a recess which, in the normal direction (N), is aligned with the injection opening and also with the outlet opening.

7. The apparatus, according to claim 1, wherein:
the injection opening and the outlet opening are arranged so that a transverse flow of the second gas can be formed in the inner region.

8. The apparatus, according to claim 1, wherein:
the outlet opening is connected to a suction device.

9. The apparatus according, to claim 1, wherein:
the separating film is a PTFE film and has a thickness of between 10 μm and 200 μm.

10. A method for forming a pressure-sintering connection of a first and a second connection partner comprising the method steps of:

providing an apparatus according to claim 1; and
operating said apparatus according to the following steps:
- a) arranging the second connection partner on the first connection partner with a sintering paste layer between them;
- b) arranging the first connection partner on the supporting surface;
- c) arranging the separating film, the latter peripherally covering the two connection partners and the frame surface;
- d) lowering the frame element onto the frame surface with the separating film arranged in between;
- e) injecting a second gas into the inner region, as a result of which a first gas which is already present is displaced by being flushed out of the inner region through the outlet opening;
- f) forming the pressure-sintering connection, wherein a sintering ram presses from the normal direction (N) onto the second connection partner and, in the process, the sintering paste is converted into a sintered metal; and
- g) raising the frame element.

11. The method, according to claim 10, wherein:
during or after method step e) the first gas is sucked through the outlet opening.

12. The method, according to claim 11, wherein:
during or after method step e) the first connection partner is heated to a process temperature.

13. The method, according to claim 12, wherein:
in method step e), lowering a sintering ram frame onto a frame section of the first connection partner, then the sintering ram is lowered and, after the sintering connection is formed, the sintering ram and the sintering ram frame are raised in the normal direction (N).

14. The method, according to claim 13, wherein:
the sintering ram is raised followed by the sintering rain frame.

* * * * *